United States Patent
Habert et al.

(10) Patent No.: US 9,763,358 B2
(45) Date of Patent: Sep. 12, 2017

(54) APPARATUS WITH DIFFUSION-ABSORPTION CYCLE

(71) Applicant: ABB Technology Oy, Helsinki (FI)

(72) Inventors: Mathieu Habert, Rheinfeldon (CH); Bruno Agostini, Zürich (CH); Francesco Agostini, Zofingen (CH)

(73) Assignee: ABB Technology OY (FI)

( * ) Notice: Subject to any disclaimer, the term of this patent is extended or adjusted under 35 U.S.C. 154(b) by 126 days.

(21) Appl. No.: 14/939,408

(22) Filed: Nov. 12, 2015

(65) Prior Publication Data

US 2016/0157382 A1    Jun. 2, 2016

(30) Foreign Application Priority Data

Nov. 28, 2014 (EP) .................................... 14195342

(51) Int. Cl.
*H05K 7/00* (2006.01)
*H05K 7/20* (2006.01)
(Continued)

(52) U.S. Cl.
CPC .......... *H05K 7/2029* (2013.01); *F25B 15/10* (2013.01); *F25B 33/00* (2013.01);
(Continued)

(58) Field of Classification Search
None
See application file for complete search history.

(56) References Cited

U.S. PATENT DOCUMENTS 2,855,766 A * 10/1958 Elfving .................. F25B 15/10
                                                   62/493
4,020,646 A *  5/1977 Oda ........................ F25B 15/10
                                                   62/492
(Continued)

FOREIGN PATENT DOCUMENTS

EP    2720523 A1 *  4/2014    ......... H05K 7/20363
EP    2767783 A1     8/2014

OTHER PUBLICATIONS

European Patent Office, European Search Report issued in European Patent Application No. 14195342.2 dated Jun. 2, 2015, 8 pp.

*Primary Examiner* — Courtney Smith
*Assistant Examiner* — Zhengfu Feng
(74) *Attorney, Agent, or Firm* — Taft Stettinius & Hollister LLP

(57) ABSTRACT

The invention relates to an apparatus (1) comprising a generator (5), an evaporator (6), an absorber (8) and a condenser (9) circulating a refrigerant (R), an inert (I) and an absorbent (A) in a diffusion-absorption cycle. The generator (5) and the evaporator (6) are arranged in an electric cabinet (2) to receive a heat load from primary electric components (3) and secondary electric components (4). The absorber (8) and the condenser (9) are arranged outside of the electric cabinet (2) and at a higher level than the evaporator (6) to receive fluid from the generator (5) and the evaporator (6) and for dissipating heat from the received fluid to the surrounding environment. The inert (I) and refrigerant (R) are selected such that the inert (I) is heavier than the refrigerant (R) in order to obtain fluid circulation where the inert (I) exiting the absorber (8) flows downwards to the evaporator (6) and the inert (I) exiting the evaporator (6) flows upwards to the absorber (8).

19 Claims, 2 Drawing Sheets

(51) Int. Cl.
*F25B 15/10* (2006.01)
*F25B 33/00* (2006.01)

(52) U.S. Cl.
CPC ..... *H05K 7/20154* (2013.01); *H05K 7/20309* (2013.01); *H05K 7/20318* (2013.01); *H05K 7/20363* (2013.01); *H05K 7/20936* (2013.01); Y02B 30/62 (2013.01)

(56) References Cited

U.S. PATENT DOCUMENTS

| | | | |
|---|---|---|---|
| 7,394,655 B1* | 7/2008 | O'Keeffe | H05K 7/20363 165/104.33 |
| 2002/0056288 A1* | 5/2002 | Kim | F25B 15/006 62/476 |
| 2005/0083654 A1* | 4/2005 | Tsoi | F25B 1/06 361/699 |
| 2006/0228128 A1* | 10/2006 | Reihl | G03G 21/206 399/91 |
| 2009/0178436 A1* | 7/2009 | Chiriac | F25B 15/10 62/515 |
| 2013/0061629 A1* | 3/2013 | Leistner | F25D 11/027 62/490 |
| 2013/0091886 A1* | 4/2013 | Campbell | H05K 7/20809 62/259.2 |

* cited by examiner

APPARATUS WITH DIFFUSION-ABSORPTION CYCLE

BACKGROUND OF THE INVENTION

Field of the Invention

This invention relates to an apparatus, and more particular to an apparatus utilizing a diffusion-absorption cycle in order to cool electric components.

Description of Prior Art

Previously there is known an apparatus with a generator, an evaporator an absorber and a condenser which circulate a refrigerant, an inert and an absorbent in a diffusion-absorption cycle. In this known solution cooling can be provided at a desired location without a need to use a mechanical pump.

A drawback with the previously known solution are the dimensions of the apparatus. In practice the elements of the apparatus need to be arranged in such a way that the size of the apparatus becomes space consuming, which leads to several practical problems making it difficult to utilize the apparatus in some applications.

SUMMARY OF THE INVENTION

An object of the present invention is to provide an apparatus where a diffusion-absorption cycle can be efficiently utilized and whose shape and dimensions do not restrict the use of the apparatus in various applications. This object is achieved with the apparatus according to independent claim 1.

An apparatus where the absorber is arranged at a higher level than the evaporator and where the inert and refrigerant have been selected such that the inert is heavier than the refrigerant makes it possible to obtain advantageous dimensions for the apparatus at the same time as the performance obtained with the apparatus remains very good.

BRIEF DESCRIPTION OF DRAWINGS

In the following the apparatus will be described in closer detail by way of example and with reference to the attached drawings, in which.

DESCRIPTION OF AT LEAST ONE EMBODIMENT

Figure 1:
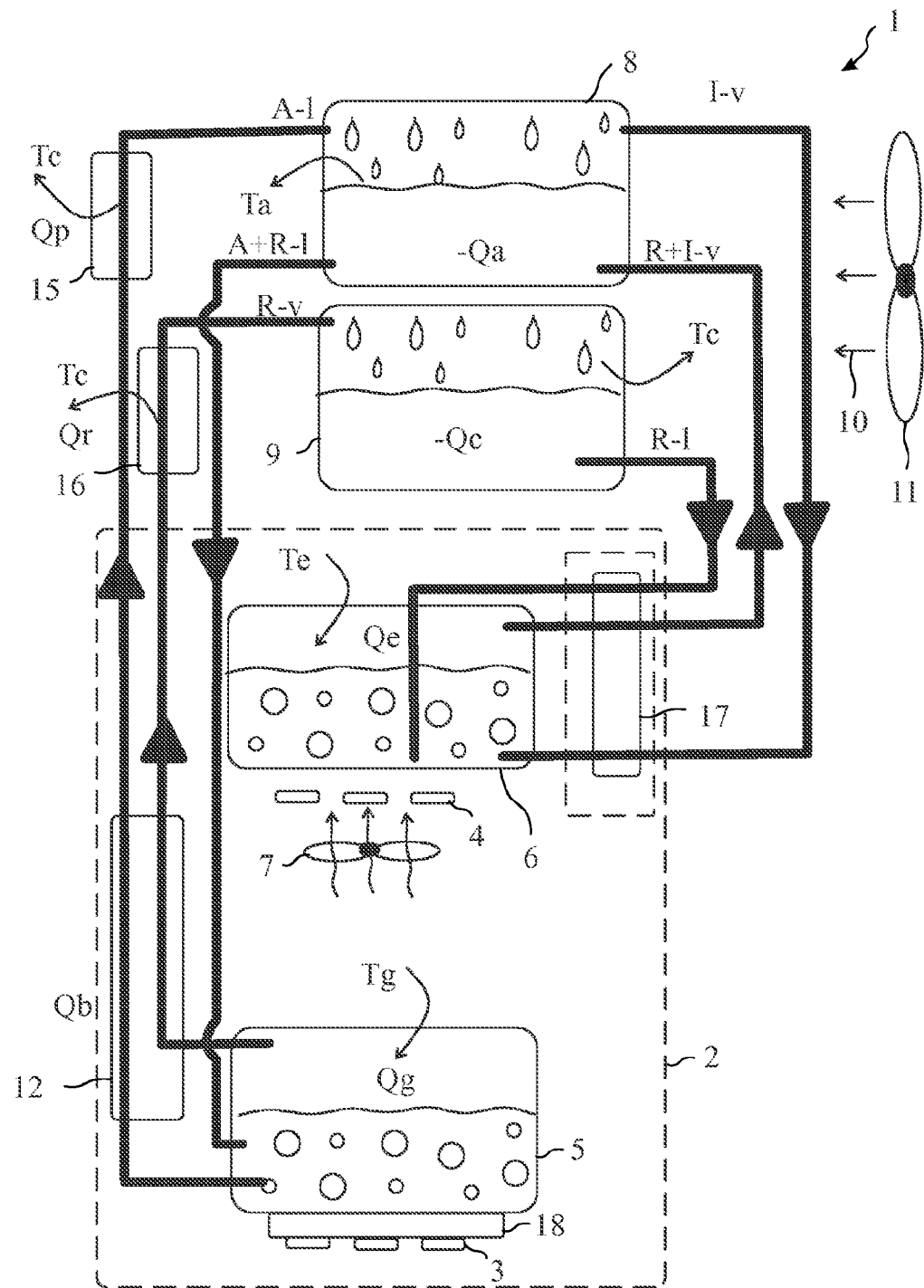
FIGS. 1 and 2 illustrate a first embodiment of an apparatus.
Figure 2:
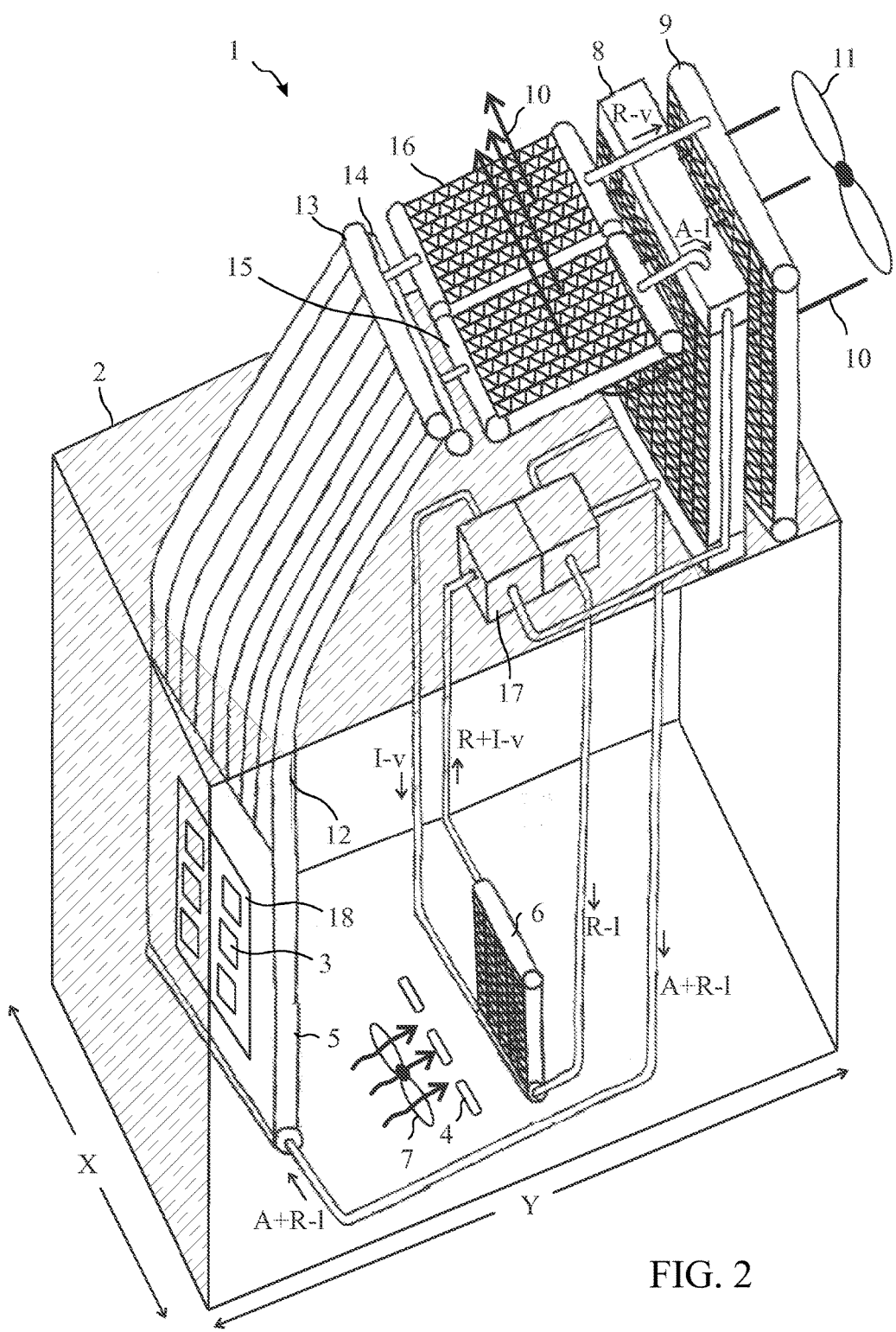

FIGS. 1 and 2 illustrate a first embodiment of an apparatus 1. The apparatus comprises an electrical cabinet 2 which encloses the components within the electrical cabinet from the surrounding environment on the outside of the electrical cabinet. In particular the electrical cabinet prevents heat from freely passing between the inside and outside of the cabinet. In practice, the electric cabinet may prevent air from freely passing between the outside and the inside of the electrical cabinet 2 by being airtight, for instance.

The electric cabinet contains primary electric components 3 and secondary electric components 4. The primary electric components 3 have a higher operating temperature than the secondary electric components 4. The illustrated apparatus 1 may be a motor drive, for instance, in other words an apparatus controlling feed of electricity to an electric motor. In that case the primary electric components 3 may include high power semiconductor components having an operating temperature of 125-150° C., for instance, and the secondary electric components 4 may include passive electric components having an operating temperature of about 65° C., for instance.

In the illustrated example the primary electric components 3 are attached to a generator 5 which is located in the electric cabinet 2, and which is provided with a fluid channel for passing heat received from the primary electric components to fluid in the fluid channel. Alternatively, instead of attaching the primary electric components to the generator 5, the generator may be arranged to receive a heat load in some other way from the primary electric components, such as via an air flow passing from the primary electric components to the generator, for instance.

The apparatus 1 comprises an evaporator 6 which is located in the electric cabinet 2 and which is arranged to receive a heat load from the secondary electric components 4. In the illustrated example this heat load is received by the evaporator 6 from the secondary electric components 4 via an air flow generated by a fan 7. However, alternatively all or some of the secondary electric components 4 may be attached to the evaporator 6. The evaporator 6 is provided with a fluid channel for passing heat received from the secondary electric components to fluid in the fluid channel.

On the outside of the electric cabinet 2 the apparatus 1 comprises an absorber 8 and a condenser 9. Both have a respective fluid channel in fluid communication with the devices that are located within the electric cabinet 2. Heat originating from the primary and secondary electric components are dissipated to the surrounding air via the absorber 8 and the condenser 9. An airflow 10 through the condenser 9 and absorber 8 may be generated with a second fan 11, for instance, in order to enhance dissipation of heat from the absorber and condenser. In the illustrated example the airflow 10, which is a cooling airflow, passes also through the pre-cooler 15 and rectifier 16 which are included in the illustrated example. For simplicity, conduits or walls facilitating that the airflow 10 is bent 90° are not illustrated in the figures. When the condenser 9 and absorber 8 receive the cooling airflow 10 first, as illustrated, and only after this the same airflow is passed to other elements of the apparatus (if necessary), such as to the pre-cooler 15 and rectifier 16, the performance of the apparatus is excellent. However, there may exist embodiments where the flow is reversed as compared to the illustrated example.

The illustrated apparatus circulates three different fluids: an absorbent A, an inert I and a refrigerant R without a need for a mechanical pump. The absorbent A and the refrigerant R have been selected such that they are miscible with each other. The inert I has been selected such that it is not miscible or sparingly miscible with the absorbent and with the refrigerant.

A rich solution of absorbent A and refrigerant R (in liquid state) leaves the absorber 8 and flows to the generator 5, where it is heated up by heat from the primary electric components 3. In the example of FIG. 2, a bubble pump 12 is arranged on top of the generator 5. The bubble pump 12 may be implemented as a group of channels having a capillary dimension. The diameter of a channel which is considered capillary depends on the fluid hat is used (boiling) inside. The following formula, for instance, can be used to evaluate a suitable diameter: $D=(sigma/(g*(rhol-rhov)))^{0.5}$, wherein sigma is the surface tension, g the acceleration of gravity, rhov the gas density and rhol the liquid density. Typically the internal diameter of such capillary channels is around 1.5 mm.

One alternative is to utilize multiport extruded tubes, where each tube contains a plurality of channels separated from each other by longitudinal walls. The channels of the bubble pump 12 extend from the inside of the electric cabinet to the outside of the electric cabinet 2. One alternative is to provide the generator with the bubble pump, in other words to manufacture these elements as one single element.

When heat is supplied by the generator 5 to the rich liquid solution of absorbent A and refrigerant R, the refrigerant R evaporates and vapor bubbles rise up and enter the bubble pump 12 where each confined bubble acts as a gas piston and lifts liquid slug with the absorbent A upward. The upper end of the bubble pump 12 is provided with a manifold 13 which receives the fluid from the channels of the bubble pump 12. This manifold 13 may be implemented as a tube providing a fluid path between each of the channels of the bubble pump. A reservoir 14 is provided as a second tube, which is in fluid communication with the manifold 13 and located lower than the manifold 13. Thereby liquid and vapor exiting the channels of the bubble pump 12 at the upper end are separated by gravity. The weak solution of refrigerant and absorbent (mainly absorbent A) in liquid state flows downwards by gravity and accumulates into the reservoir 14 from where it is passed via a pre-cooler 15 to the absorber 8. Efficient accumulation of the liquid into the reservoir is achieved in the example of FIG. 2 by utilizing a bubble pump that is curved. The vapor containing refrigerant R and a rest of absorbent A is passed from the manifold 13 to a rectifier 16 where the rest of the absorbent A is removed.

Almost pure refrigerant R in vapor state entering the condenser 9 from the rectifier 16 is condensed in the air cooled condenser 9. The refrigerant R in a liquid state flows downwards from the condenser 9 to the evaporator 6 via a gas heat exchanger 17. The gas heat exchanger 17 is similarly as the evaporator 6 located inside of the electrical cabinet 2. The gas heat exchanger 17 may, however, have an own thermally insulated compartment within the electrical cabinet 2.

Rich inert I in vapor state flows downwards from the absorber 8 to the evaporator 6 via the gas heat exchanger 17. This rapidly reduces the partial pressure of the refrigerant R in liquid state in the evaporator 6. As a consequence, the refrigerant R evaporates at a relatively low temperature, which makes it possible for the evaporator to cool the airflow form the secondary electric components 4, or alternatively, any secondary electric components directly attached to the evaporator 6. The resulting refrigerant R and inert I vapor mixture flows via the gas heat exchanger 17 upwards to the absorber 8. The gas heat exchanger 17 pre-cools the liquid refrigerant R and inert I vapor moving towards the evaporator 6 by transferring heat to the vapour refrigerant R and vapor inert I mixture moving towards to the absorber 9.

The weak solution consisting mainly of liquid absorbent A that is passed to the absorber 8 from the pre-cooler 15 absorbs the refrigerant R vapor which is passed to the absorber from the evaporator 6. The resulting rich solution of liquid absorbent A and refrigerant R flows downwards from the absorber 8 to the generator 5.

In order to facilitate the above fluid circulation in the illustrated apparatus where the absorber 8 is located higher than the evaporator 6, the fluids are selected in such a way that the inert I is heavier than the refrigerant R. Thereby the rich inert gas from the outlet of the absorber will flow down and the weak inert gas in the mixture of evaporated refrigerant R and inert I vapor from the evaporator will flow up, as previously explained. An advantage with such a solution is that the absorber may be arranged as in the illustrated example, on the outside of a roof of the electric cabinet, in other words on top of the electrical cabinet 2 together with the condenser 9, the rectifier 16 and the pre-cooler 15. This facilitates that width X and the depth Y of the apparatus may be relatively small, as in the illustrated example it is sufficient that the electric cabinet 2 has room for the evaporator 6, the generator 5 and the gas heat exchanger 17. No other devices are needed in the electrical cabinet on the outer sides of the electrical cabinet 2, for instance, but instead the other devices may be arranged on top of the electric cabinet 2. Additional advantages obtained with such a solution is that the length of the piping between the devices of the apparatus is relatively short and that a fan with a low power may be employed as the air flow path is short due to lower pressure drop, as the devices can be arranged relatively close to each other. This reduces pressure drop and facilitates that pipes of a smaller diameter can be utilized.

Examples of absorbents A for use in the illustrated device include:
  alkyl acetamides, linear and cyclic (DMEU or DMAC for example),
  carbonate esters (DMC for example), and
  glycol ethers (DMEDEG, DMETEG, DMETrEG for example)

If the inert I is selected to be Xenon (132 g/mol), a suitable refrigerant R may be:
  R134a or 1,1,1,2-Tetrafluoroethane (102 g/mol)
  R1233zd or 1-chloro-3,3,3-trifluoropropene (130 g/mol),
  R1234ze or 1,3,3,3-tetrafluoroprop-1-ene (114 g/mol),
  R1234yf or 2,3,3,3-Tetrafluoropropene (114 g/mol),
  R152a or 1,1-Difluoroethane (66 g/mol)

If the inert I is selected to be Krypton (82 g/mol), a suitable refrigerant R may be:
  R152a or 1,1-Difluoroethane (66 g/mol)

As illustrated in FIG. 2, the evaporator 6, the rectifier 16, the pre-cooler 15, the absorber 8 and the condenser 9 may all be implemented as heat exchangers having a flow channel consisting of manifolds in the opposite ends, and with parallel pipes passing fluid between these manifolds. This facilitates that air can pass between the pipes. In order to enhance exchange of heat, fins may be arranged to extend between walls of the parallel pipes. Suitable materials for manufacturing these heat exchangers include aluminum, copper, carbon steel, stainless steel and titanium. The generator 5 and bubble pump 12 may be manufactured as one element having a similar construction as the above mentioned heat exchangers. However, instead of fins, the generator may be provided with a metallic base plate 18 having grooves into which the parallel pipes at least partly penetrate.

It is to be understood that the above description and the accompanying figures are only intended to illustrate the present invention. It will be obvious to a person skilled in the art that the invention can be varied and modified without departing from the scope of the invention.

The invention claimed is:
1. An apparatus comprising:
  a generator, an evaporator, an absorber and a condenser circulating a refrigerant, an inert and an absorbent in a diffusion-absorption cycle, wherein
    the generator and the evaporator are arranged in an electric cabinet separating the generator and evaporator from the surrounding environment,
  the generator is arranged to receive a heat load from primary electric components in the electric cabinet and to pass the heat load into fluid in the generator for evaporating at least a part of the fluid with the heat load from the primary electric components, the evaporator is arranged to receive a heat load from secondary electric components in the electric cabinet which have a lower operating temperature than the primary electric components and to pass the heat load into fluid in the evaporator for evaporating at least a part of the fluid with the heat load from the secondary electric components, the absorber and the condenser are arranged outside of the electric cabinet and at a higher level than the evaporator to receive fluid from the generator and the evaporator and for dissipating heat from the received fluid to the surrounding environment, and the inert is heavier than the refrigerant whereby the inert exiting the absorber flows downwards to the evaporator and the inert exiting the evaporator flows upwards to the absorber.

2. The apparatus according to claim 1, wherein the apparatus is provided with a bubble pump comprising a plurality of capillary dimensioned channels receiving fluid from the generator and providing the absorber and the condenser with fluid from the generator.

3. The apparatus according to claim 2, wherein the generator and bubble pump are manufactured as one single element.

4. The apparatus according to claim 2, wherein an upper end of the generator is provided with a manifold and with a reservoir which is located below the manifold and which is in fluid communication with the manifold for separating vapor and liquid exiting the bubble pump from each other, and the manifold is in fluid communication with the condenser for providing the condenser with vapor from the bubble pump, and the reservoir is in fluid communication with the absorber for providing the absorber with liquid from the bubble pump.

5. The apparatus according to claim 4, wherein the apparatus comprises a rectifier providing said fluid communication between the manifold and the condenser, and a pre-cooler providing said fluid communication between the reservoir and the absorber.

6. The apparatus according to claim 1, wherein the apparatus comprises a gas heat exchanger arranged in the electric cabinet to transfer heat from fluid forwarded from the evaporator to the absorber to fluid which is forwarded from the absorber to the evaporator and from the condenser to the evaporator.

7. The apparatus according to claim 1, wherein the absorber is arranged on the outside of a roof of the electric cabinet.

8. The apparatus according to claim 1, wherein the apparatus comprises a fan arranged in the electrical cabinet for generating an airflow passing heat from the secondary components to the evaporator.

9. The apparatus according to claim 1, wherein the apparatus comprises a fan arranged outside of the electrical cabinet to generate an cooling airflow at least through the condenser and the absorber, said airflow reaching other elements of the apparatus only after having passed the condenser and the absorber.

10. The apparatus according to claim 1, wherein the generator is provided with a base plate to which the primary electric components are attached for conducting heat via the base plate to fluid in the generator.

11. The apparatus according to claim 2, wherein the apparatus comprises a gas heat exchanger arranged in the electric cabinet to transfer heat from fluid forwarded from the evaporator to the absorber to fluid which is forwarded from the absorber to the evaporator and from the condenser to the evaporator.

12. The apparatus according to claim 4, wherein the apparatus comprises a gas heat exchanger arranged in the electric cabinet to transfer heat from fluid forwarded from the evaporator to the absorber to fluid which is forwarded from the absorber to the evaporator and from the condenser to the evaporator.

13. The apparatus according to claim 2, wherein the absorber is arranged on the outside of a roof of the electric cabinet.

14. The apparatus according to claim 2, wherein the apparatus comprises a fan arranged in the electrical cabinet for generating an airflow passing heat from the secondary components to the evaporator.

15. The apparatus according to claim 4, wherein the apparatus comprises a fan arranged in the electrical cabinet for generating an airflow passing heat from the secondary components to the evaporator.

16. The apparatus according to claim 2, wherein the apparatus comprises a fan arranged outside of the electrical cabinet to generate an cooling airflow at least through the condenser and the absorber, said airflow reaching other elements of the apparatus only after having passed the condenser and the absorber.

17. The apparatus according to claim 4, wherein the apparatus comprises a fan arranged outside of the electrical cabinet to generate an cooling airflow at least through the condenser and the absorber, said airflow reaching other elements of the apparatus only after having passed the condenser and the absorber.

18. The apparatus according to claim 2, wherein the generator is provided with a base plate to which the primary electric components are attached for conducting heat via the base plate to fluid in the generator.

19. The apparatus according to claim 4, wherein the generator is provided with a base plate to which the primary electric components are attached for conducting heat via the base plate to fluid in the generator.

* * * * *